United States Patent [19]
Kamikawa et al.

[11] Patent Number: 5,301,700
[45] Date of Patent: Apr. 12, 1994

[54] WASHING SYSTEM

[75] Inventors: Yuuji Kamikawa, Uto; Kouki Kuroda, Kurume; Yoshiyuki Honda, Kumamoto; Eiichi Mukai; Mitsuo Nishi, both of Kurume, all of Japan

[73] Assignees: Tokyo Electron Limited, Tokyo; Tokyo Electron Saga Limited, Tosu, both of Japan

[21] Appl. No.: 26,771

[22] Filed: Mar. 5, 1993

[30] Foreign Application Priority Data

Mar. 5, 1992 [JP] Japan ................................. 4-83216
Mar. 18, 1992 [JP] Japan ................................. 4-62083
Mar. 24, 1992 [JP] Japan ................................. 4-96073
Sep. 18, 1992 [JP] Japan ................................. 4-249252

[51] Int. Cl.$^5$ .............................................. B08B 3/02
[52] U.S. Cl. ................................. 134/76; 134/102.3; 134/166 R; 134/902; 134/201
[58] Field of Search ............ 134/104.1, 166 R, 102.1, 134/102.3, 133, 201, 902, 61, 76

[56] References Cited

U.S. PATENT DOCUMENTS 4,437,479  3/1984  Bardina ................................. 134/68
4,941,489  7/1990  Kamimura et al. .................. 134/153

FOREIGN PATENT DOCUMENTS 60-231337 11/1985 Japan .
1-12534   1/1989  Japan .................................... 134/902

OTHER PUBLICATIONS

Patent Abstracts of Japan, Apr. 7, 1992, Y. Kushima, "Cover Mechanism for Movable Zone."

*Primary Examiner*—Frankie L. Stinson
*Attorney, Agent, or Firm*—Oblon, Spivak, McClelland, Maier & Neustadt

[57]    ABSTRACT

A washing system comprising a wafer washing section having plural chemical washing vessels, plural water washing vessels and a drier, a cassette washing section having a water washing device and a drier, a loader section for taking out the wafers from the cassettes and loading the wafers into the wafer washing section, an unloader section for returning the washed wafers in the washed cassette and unloading the wafers from the wafer washing section, a wafer transfer device the wafers in the wafer washing section, a cassette lifter for carrying the cassettes from the loader section to the cassette washing section, and a wire drive unit for carrying the cassettes in the cassette washing section.

12 Claims, 12 Drawing Sheets

WASHING SYSTEM

BACKGROUND OF THE INVENTION

1. Field of the Invention

The present invention relates to a washing system for washing semiconductor wafers and wafer cassettes.

2. Description of the Related Art

Semiconductor devices such as super LSIs have been more and more highly integrated and their circuit patterns have been micro-structured to an order of submicrons. In addition, the diameter of semiconductor wafers has been made large to 8 inches and even 12 inches. When such a small amount of particles that could be hitherto neglected adhere to semiconductor wafers, therefore, the productivity of wafers is remarkably lowered. In order to overcome this, the semiconductor wafers are immersed into acid and alkali solutions in process vessels so that their surfaces can be made clean.

The automatic washing system can be cited as a system for washing the surface of each wafer. It has plural process vessels in which the semiconductor wafers are washed by chemical solutions and water and then dried. Namely, an ammonium solution vessel, a water-washing vessel, a rinsing vessel, a hydrofluoric acid vessel and a drying chamber are arranged in it to enable a series of processes to be sequentially applied to the semiconductor wafers.

In the case of this automatic washing system, twenty five sheets of semiconductor wafers are housed in a cassette and they are immersed together with the cassette in the chemical solution in each process vessel. After they are immersed in this manner, the cassette is picked up out of the process vessels and washed by water and then dried.

However, the wafer cassette has a plurality of grooves in which wafers are seated, and the whole of the cassette is thus made complicated in shape. This makes it difficult to remove acid and alkali solutions from the cassette. When the cassette is repeatedly immersed in acid and alkali solutions, material (e.g. an ethylene fluoride system resin) of which the cassette is made solves little by little into the chemical solutions to degrade them in the process vessels.

According to the automatic washing system now used, therefore, the wafers are taken out of the cassette and are immersed and washed in the chemical solutions. The wafers which have been thus made clean are then returned into their original cassette.

In the case of the automatic washing system, however, there is fear that particles and dust which have stuck to the original cassette move to the wafers which have been made clean to contaminate them. The reason why particles and dust adhere to the cassettes is that they are contacted directly with and come near to various carrier units in the clean room and that particles and dust are caused at drive sections of these carrier units. The amount of particles and dust thus stuck to the cassettes reaches to such a value that cannot be neglected. In addition, oils and fats, chemical solutions and other matters sometimes adhere to the cassettes.

Further, when the wafers themselves come near to the carrier units, the particles and dust caused will adhere to them.

SUMMARY OF THE INVENTION

The object of the present invention is therefore to provide a washing system capable of preventing dust, particles and contaminating objects adhered to a cassette from transferring to a semiconductor wafer and also capable of preventing dust and particles caused at drive mechanisms of conveying units from transferring to a wafer.

According to an aspect of the present invention, there can be provided a washing system comprising a wafer washing section having means for washing plural semiconductor wafers by chemical solution, means for washing the wafers by water and means for drying the wafer; a cassette washing section having means for washing plural cassettes by water and means for drying the wafers; a loader section for taking out the wafers from the cassette and for loading the wafers into the wafer washing section; an unloader section for returning the wafers in the washed cassette and unloading the washed wafers from the wafer washing section; means for carrying the wafers in the wafer washing section; and means for carrying the cassettes from the loader section to the cassette washing section.

The wafers are washed in the wafer washing section while the cassettes in the cassette washing section. This enables the washed wafers to be returned into the washed cassette to thereby prevent contamination such as particles from transferring from the cassettes to the wafers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, it will be described in detail how a washing system of the present invention and its modified ones are used to wash and clean semiconductor wafers.

Figure 1:
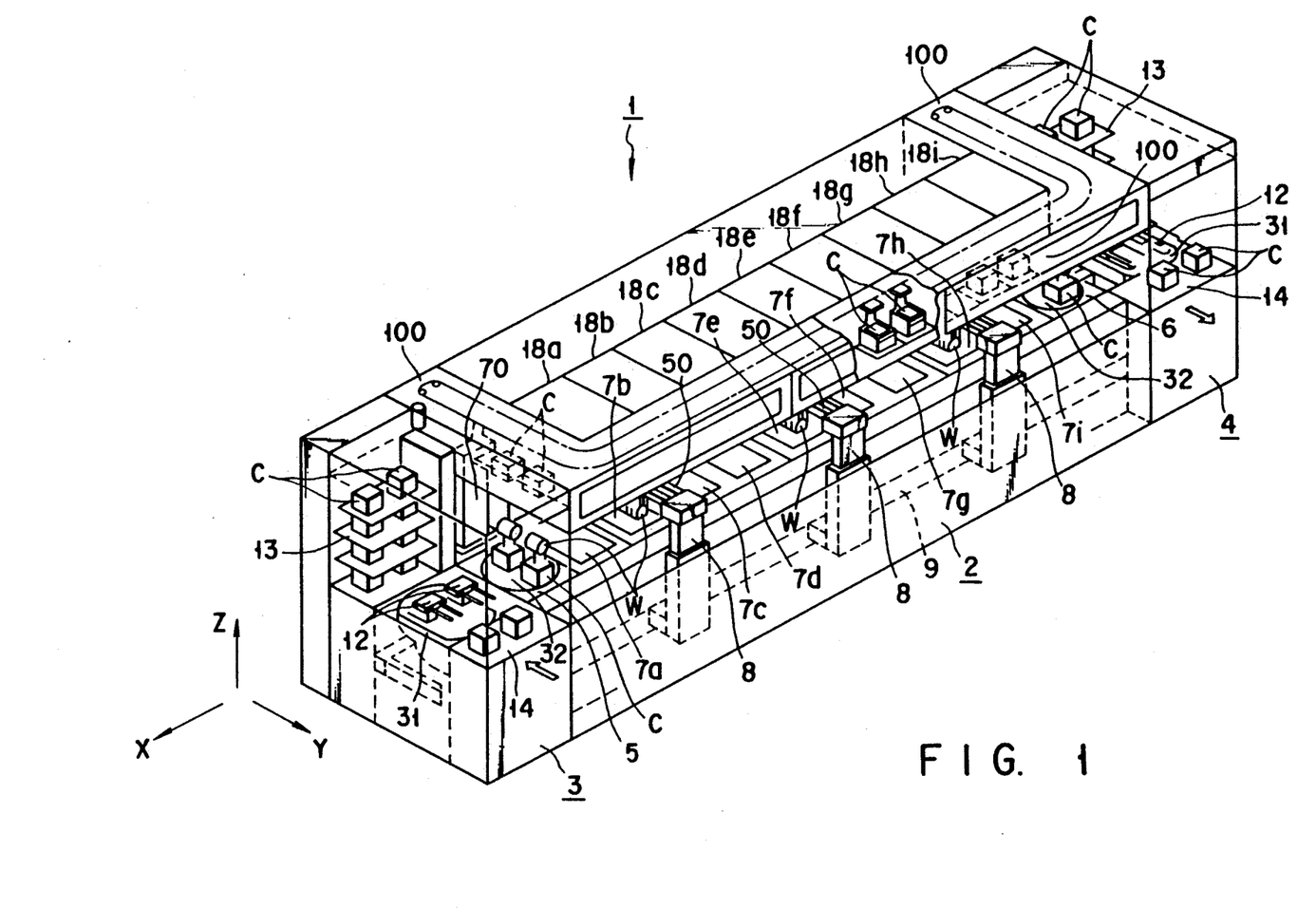
FIG. 1 is a perspective view showing the whole of the washing system according to an embodiment of the present invention.

As shown in FIG. 1, a washing system 1 comprises three sections, that is, a washing section 2 and input and output buffer sections 3 and 4. The input buffer section 3 is located on the side of a loader section 5 and the output buffer section 4 on the side of an unloader section 6. The washing section 2 includes a lower area for washing semiconductor wafers and an upper area for washing wafer cassettes. Both of a passage 100 in the cassettes washing area are communicated with the input and output buffer sections 3 and 4.

The input and output buffer sections 3 and 4 are substantially same in structure. Description will be made, therefore, on the input buffer section 3 but not on the output buffer section 4.

Two cassettes C are received on a port 14 at the input buffer section 3. 25 sheets of 8-inch (or 6-inch or 5-inch) silicon wafers W are housed in each of the cassettes C. Two cassette carrier units 12 are opposed to the port 14. These two cassette carrier units 12 are mounted on turntables 31.

Figure 2:
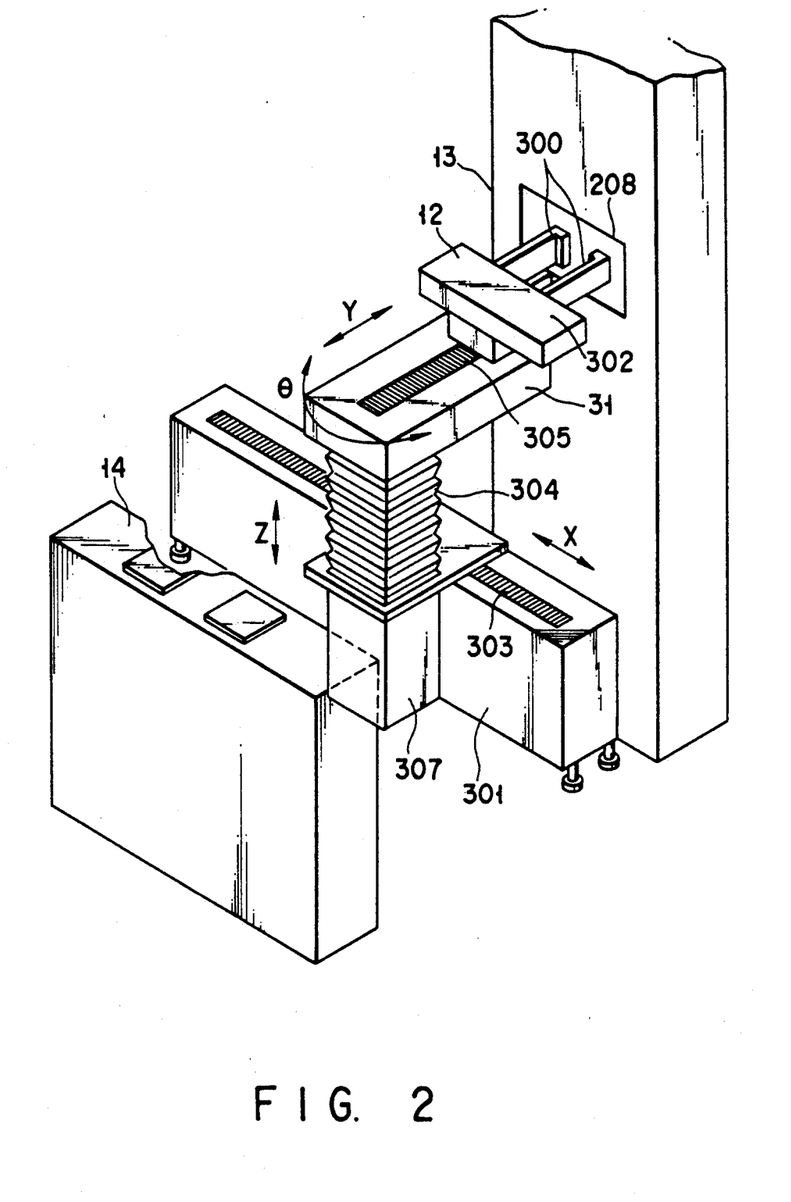
FIG. 2 is a perspective view showing a wafer carrier mechanism provided with input and output buffer sections of the washing system.

As shown in FIG. 2 (where only one of the cassette carrier units 12 is shown for the sake of simplicity), the cassette carrier unit 12 is located between the port 14 and a cassette stocking unit 13. It has two pairs of chucks 300 at its front end. The chucks 300 are made of resin such as PEEK or PVC. They are supported by an X-axis mover 301, a Y-axis mover 302 and the θ-direction rotator (or turn-table) 31. They are also supported by a Z-axis mover 307. The drive part of the X-axis mover 301 is sealed by a seal belt 303, that of the Y-axis mover 302 by a seal belt 305, and that of the Z-axis mover 307 by a bellows seal 304. These seal belts 303, 305 and bellows seal 304 are made of ethylene tetrafluoride resin. Exhausts (not shown) are connected to these components.

Figure 3:
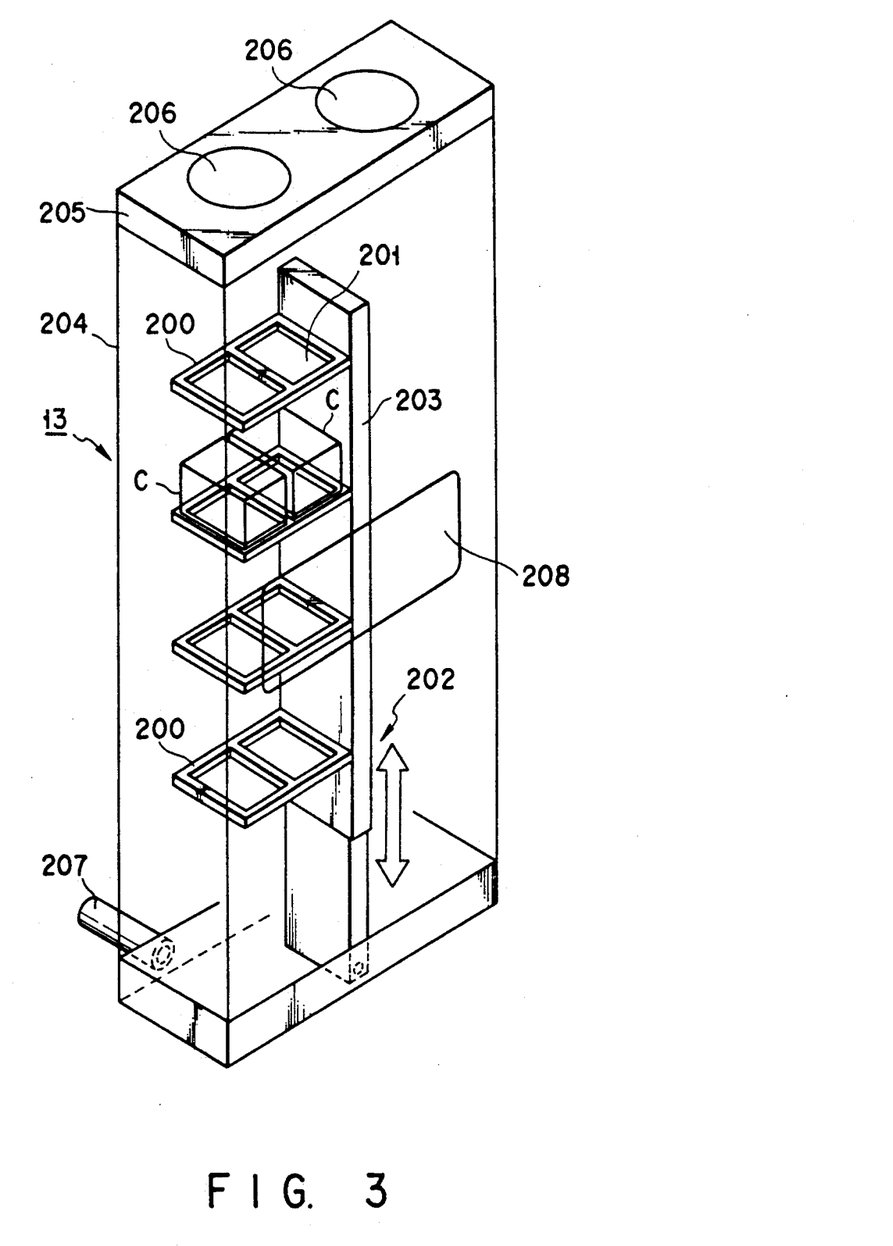
FIG. 3 is a perspective view showing a cassette stocking unit.

As shown in FIG. 3, the cassette stocking unit 13 includes therein four compartments 200 piled like steps in the vertical direction. Two cassettes C are housed in each of these four compartments 200. The compartments 200 are supported by an elevator unit 202 in which a ball screw drive mechanism is housed. The elevator unit 202 moves the compartments 200 up and down at a speed of 5 mm-70 mm/sec. It is enclosed by a cylindrical cover 203. An exhaust pipe 207 is connected to the lower end of the cover 203.

The compartments 200 and the elevator unit 202 are housed in a box-like case 204. A filter unit 205 having a filter (or ULPA filter, for example) for removing dust and particles, and fans 206 are arranged on the top of the case 204. Openings 201 are formed in the bottom of each of the compartments 200 to allow clean air to flow, as a down flow, from up to down through them.

The case 204 has an opening 208 through which the cassettes C are carried in and out of the case 204.

Figure 4A:
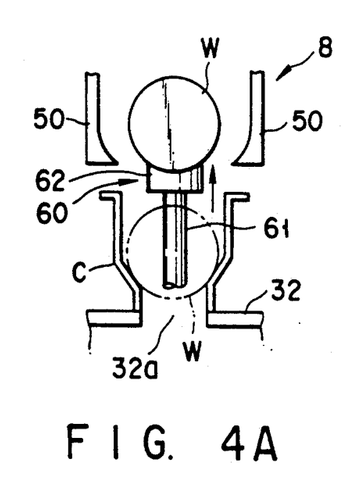
FIGS. 4A and 4B schematically show wafer lifter and chuck.
Figure 4B:
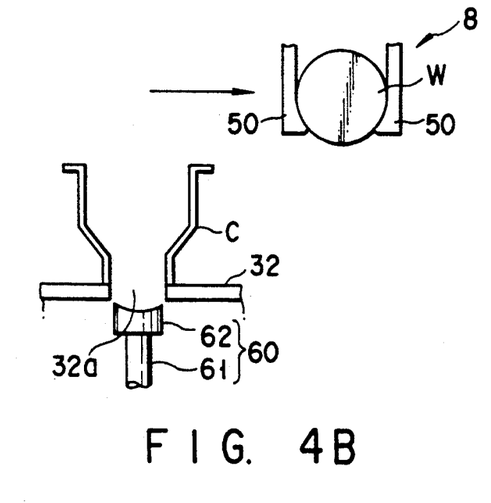

As shown in FIGS. 4A and 4B, a wafers lifter 60 is arranged under a turntable 32 at the loader section 5. The cassettes C are mounted on the table 32 in such a way that their openings are aligned with an opening 32a of the table 32. A member 62 of the wafers lifter 60 is arranged to come into and out of the opening 32a of the table 32. 25 grooves are formed on the top of the member 62 and when a rod 61 is projected from a lift cylinder (not shown), wafers are held an the grooves of the member 62. Needless to say, another same wafers lifter 60 is arranged at the unloader section 6. A wafer chuck 50 moves from a washing vessel 7a to the loader section 5 to receive the wafers W from the lifter 60. The loader section 5 is provided with an aligning device (not shown) for aligning orientation flats of the wafers W with one another and with a wafer counter (not shown) for detecting the number of the wafers W.

As shown in FIG. 1, the loader and unloader sections 5 and 6 are located on both sides of the washing section 2 and seven vessels 7a–7i are arranged side by side on a line between these sections 5 and 6. The wafers W can be thus successively washed and cleaned while moving from the vessel 7a to the one 7i. The vessels 7a and 7h are intended to wash and dry the wafers chuck 50, the vessels 7b and 7e contain chemical solutions, the vessels 7c, 7d, 7f and 7g are intended to wash the wafers W and the vessel 7i to dry them. These vessels 7a–7i are housed in their corresponding chambers 18a–18i, which are partitioned by opening-provided shutters or partition plates (not shown).

Three wafers carrier mechanisms or units 8 are arranged along the line of the vessels 7a–7i. Each of the wafers carrier units 8 has the wafer chuck 50, by which fifty sheets of wafers a, maximum, can be held together. A switching window made by a transparent acrylic plate is attached to the front aide of the washing section 2 and the vessels 7a–7i can be viewed from outside through the window.

The passage 100 in which the cassettes C are washed while passing through it is arranged in the upper portion of the washing section 2. A plurality of exhaust pipes are arranged in the lower portion of it. A plurality of tanks in which chemical solutions and pure water are contained are also arranged in the rear portion of it. A lifter 70 is arranged in it to lift the cassettes C from the loader section 5 into the passage 10. Another same cassette lifter 70 is also arranged in the unloader section 6.

Figure 5:
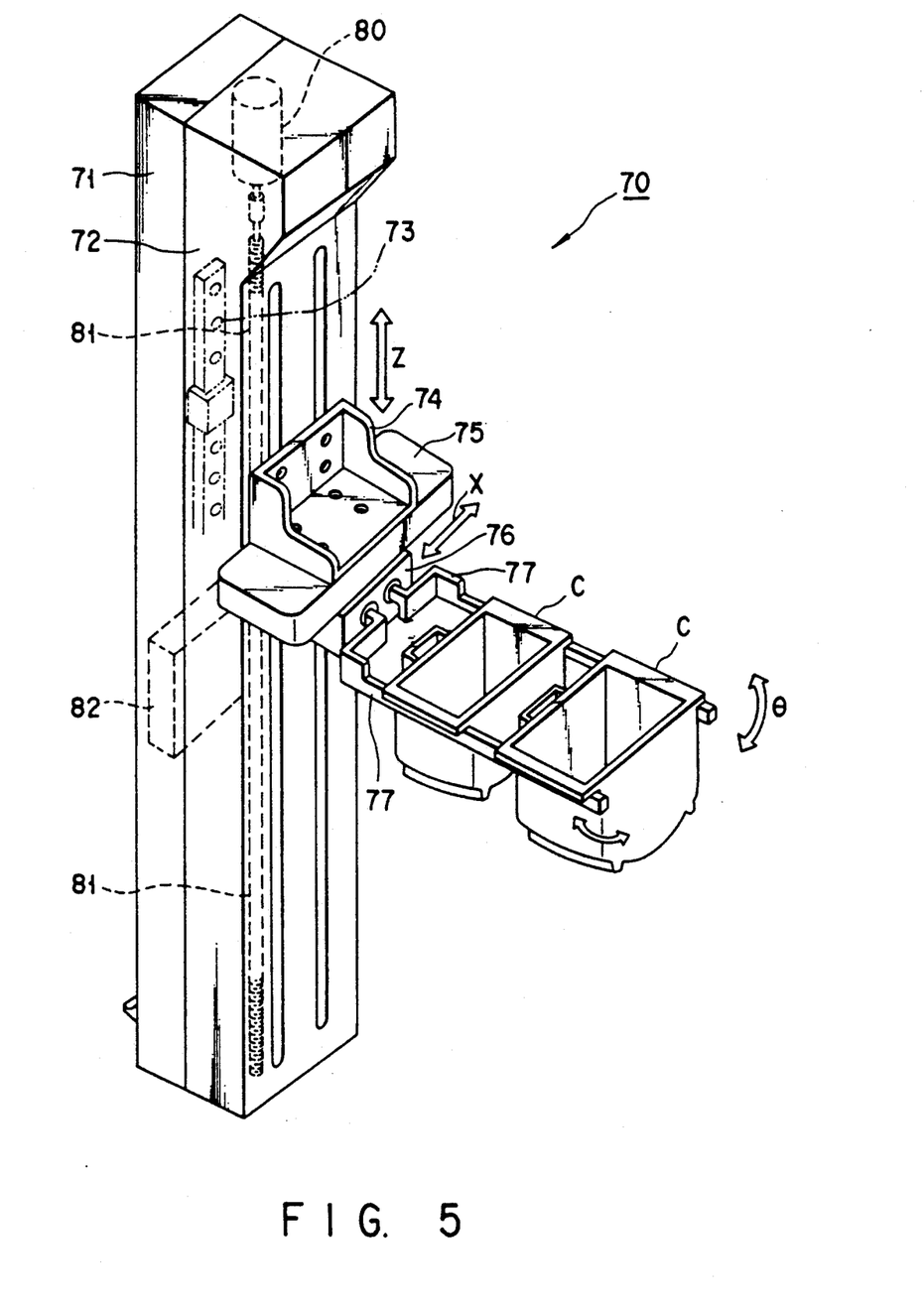
FIG. 5 is a perspective view showing a cassette lifter.

As shown in FIG. 5, the cassette lifter 70 has two fingers 77, by which two cassettes are lifted at the same time. A Z-axis mover 72 for the cassette lifter 70 is fixed to a support 71 and supported by it. The Z-axis mover 72 includes a motor 80 and a ball screw 81. Ball nuts (not shown) are attached to the rear side of a moving base 74 and they are toothed with the ball screw 81. The moving base 74 is supported, balancing a balance 82, and guided along a linear motion bearing 73. An X-axis mover 75 is attached to the underside of the moving base 74. Further, a θ-direction rotator 76 is attached to the underside of the X-axis mover 75. The two fingers 77 extend horizontal from the θ-direction rotator 76. Base end portions of these two fingers 77 are bent like cranks. When the fingers 77 are swung along the axis θ by the θ-axis rotator 76, they obliquely advance approach to the cassettes C from above position, while drawing arc-like curves, and they embrace them under their collars. In other words, the cassettes C are hung from the fingers 77 by their collars.

Figure 6:
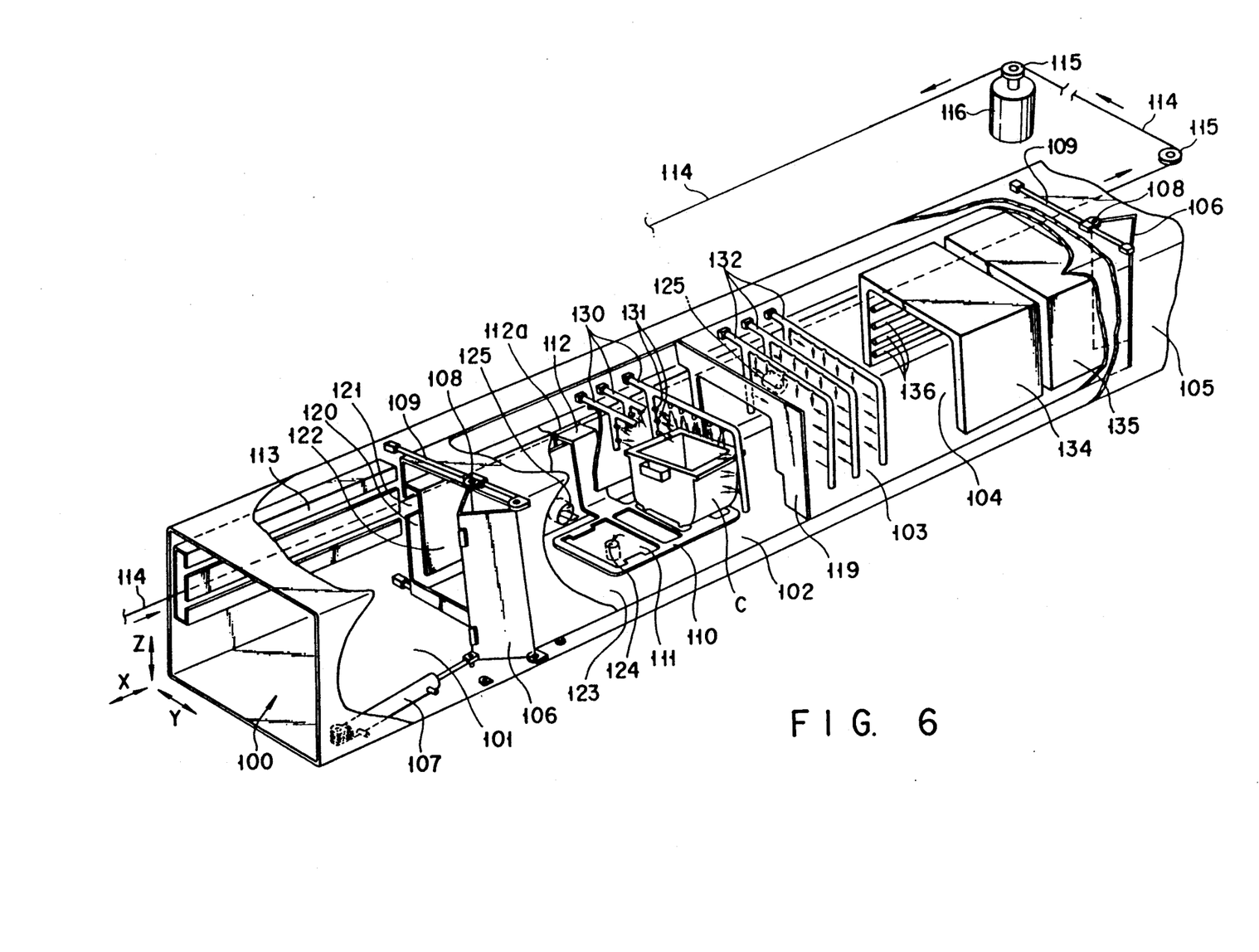
FIG. 6 is a perspective view showing a cassette washing passage partly cut.

The cassette washing passage 100 will be now described, referring to FIGS. 1 and 6.

The passage 100 is made substantially air-tight at its main portion and its both open ends are communicated with the loader and unloader sections 5 and 6. The main portion of the passage 100 extends straight along the front side of the system 1, that is, along the axis X. The switching window made of transparent acryl is fitted in the wall by which the main portion of the passage 100 is enclosed, and the cassettes C in the passage 100 can be viewed from outside through the window.

As shown in FIG. 6, the passage 100 includes therein a cassettes carrying-in section 101, a water-washing section 102, a gas-jetting section 103, a heat-drying section 104 and a cassettes carrying-out section 105. Plural moving stages 110 are arranged in the passage 100. Two cassettes C are mounted on each of the moving stages 110. A slider 112a is attached to the front end of an arm 112 of the moving stage 110 and it is slid relative to a rail unit 113 while being guided along a slit 121 of a guide 120. A wire 114 extends in the rail unit 113 and drive force is added to the slider 112a of the moving stage 110 by the wire 114. When drive force is added from the wire 114 to the slider 112a, the cassettes C on the moving stage 110 are passed through the five sections 101, 102, 103, 104 and 105. Each of pulley 115 is provided in a corner of the line of the wire 114, respectively. One of pulley 115 is rotated by a motor 116 which has a reduction gears. It is made of stainless steel and coated with ethylene tetrafluoride resin.

A shutter 106 is interposed between the carrying-in section 101 and the water-washing section 102. The shutter 106 is of the accordion curtain type, having a rail wheel 108 and a slide rail 109, and it is opened and closed by a cylinder 107. Three spray pipes 130 are arranged side by side in the water-washing section 102. Each of the spray pipes 130 has a plurality of nozzles 131 and it is shaped like a fallen U. When the cassettes C on the moving stage 110 are passed through the U-shaped spray pipes 130, pure water is sprayed from three directions against the cassettes C through the nozzles 131 of the spray pipes 130. The moving stage 110 is formed with drain openings 111 and the water-washing section 102 has a drain opening 124 in the bottom thereof and a gas exhaust opening 125 in a side wall thereof. The rail unit 113 and the guide 120 are protected from water by a water-proof plate 122.

A partition plate 119 is interposed between the water-washing section 102 and the gas-jetting section 103. The cassettes C on the moving stage 110 pass through an opening of the partition plate 119. Three gas-jetting pipes 132 are arranged side by side in the gas-jetting section 103. Each of the gas-jetting pipes 132 is shaped like a fallen U and when the cassettes C on the moving stage 110 are passed through the U-shaped pipes 132, dry nitrogen gas is jetted from three directions against the cassettes C through nozzles of the pipes 132.

Two heating units 134 and 135 are arranged in the heat-drying section 104. Plural far-infrared heaters 136 are arranged on the inner face of each of the heating units 134 and 135. A switching shutter 108 is located on the outlet side of the heat-drying section 10a. The inner face of each of the heating units 13a and 135 is made by an $SiO_2$ plate coated with tantalum to have a high reflection rate.

The wafer carrier mechanism or unit will be now described with reference to FIGS. 7 through 11.

Figure 7:
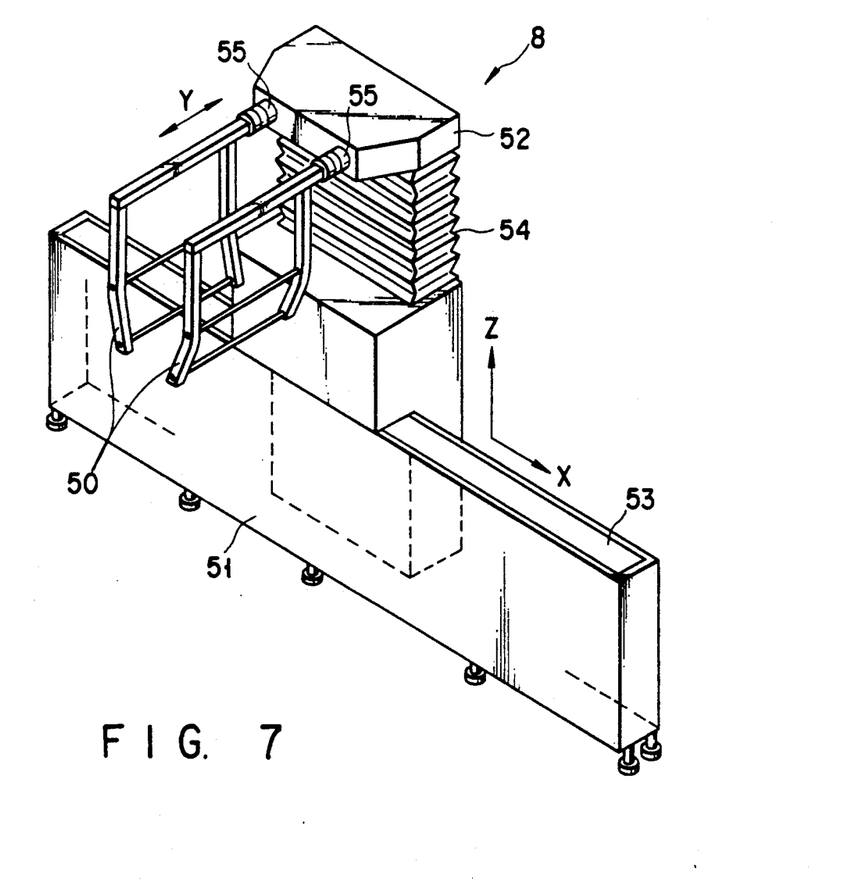
FIG. 7 is a perspective view showing a wafer carrier mechanism at the washing section.

As shown in FIG. 7, the wafer carrier unit 8 has the wafer chuck 50 made of quartz or PEEK, by which fifty sheets of wafers W are held. A carrying base 51 is arranged along the line of the process vessels 7a–7i. The wafer chuck 50 is attached to a chuck base 52 movable along the X- and Z-axis.

The X-axis drive section of the carrying base 51 is sealed by a teflon-made seal belt 53, the Z-axis drive section thereof by a bellows seal 54 and the Y-axis drive section of the chuck base 52 by bellows seals 55 to seal their mechanical drive parts.

Figure 8:
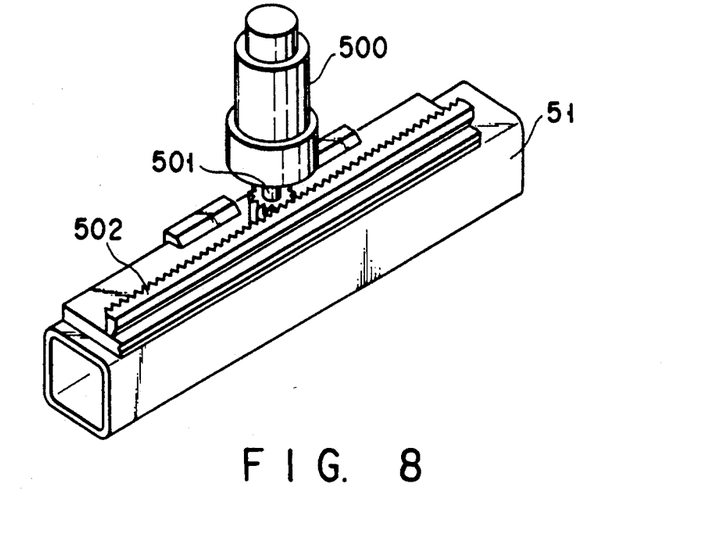
FIG. 8 is a perspective view partly showing a drive section of the wafer carrier mechanism at the washing section.

As shown in FIG. 8, the X-axis drive mechanism of the chuck base 52 is of the rack pinion type, comprising a motor 500, a pinion 501 attached to a drive shaft of the motor 500. and a rack 502 of the carrying base 51 engaged with the pinion 501.

Figure 9:
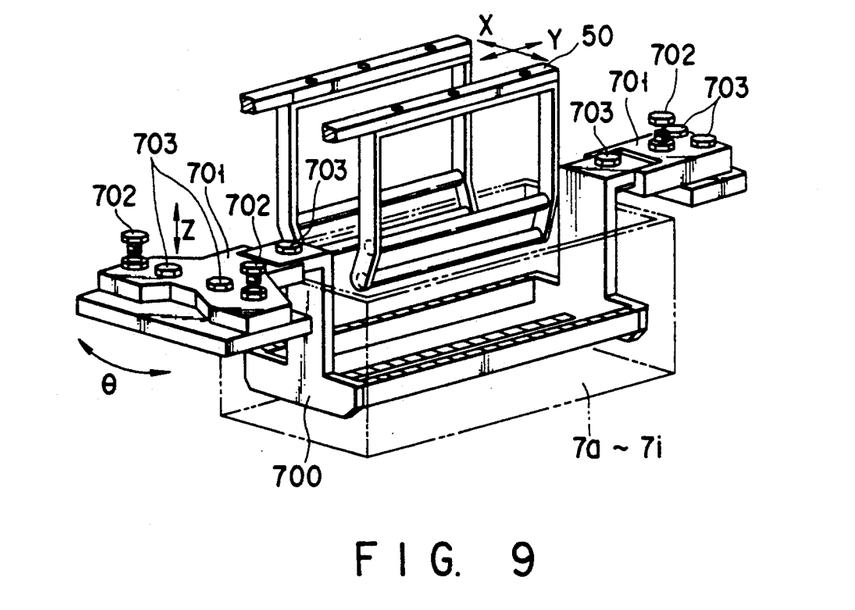
FIG. 9 is a perspective view showing chuck arms of the wafer carrier mechanism at the washing section and a wafer boat in a chemical solution vessel.

As shown in FIG. 9, a wafer boat 700 is arranged in each of the process vessels 7a–7i. The wafer chuck 50 is moved along the Y-axis by the chuck base 52. This movement of the wafer chuck 50 along the Y-axis is intended to correct that position of the wafer chuck 50 relative to the wafer boat 700 where wafers W are transferred from the wafer chuck 50 into the wafer boat 700. In other words, the wafer boat 700 as not always stopped correctly relative to the carrying base 51 or sometimes stopped, positionally shifting from the carrying base 51. Therefore, this positional shift of the wafer boat 700 can be corrected by moving the wafer chuck 50 along the Y-axis. The extent to which the wafer chuck 50 must be moved along the Y-axis to correct its wafers-transferring position in relation to the wafer boat 700 is previously determined every process vessel by initial adjustment and the values thus obtained are stored in the memory of a drive control unit (not shown). In order to more accurately correct this positional shift of the wafer chuck 50, it may be arranged that a reflection mirror is attached to the wafer boat 700 and that light-emitting and -receiving elements are attached to the wafer chuck 50. When light emitted from the light-emitting element of the wafer chuck 50 is reflected by the reflection mirror of the wafer boat 700 and received by the light-receiving element of the wafer chuck 50, the position of the wafer chuck 50 can be confirmed in this case.

Both ends of the wafer boat 700 are supported by position adjusters 701. The position of the wafer boat 700 can be micro-adjusted by three height-adjusting bolts 702 and fixing bolts 703. When it is adjusted from outside the process vessels 7a–7i in this manner, it can be made unnecessary for the operator to put his hands into any of the process vessels for the positional adjustment of the wafer boat 700.

Figure 10:
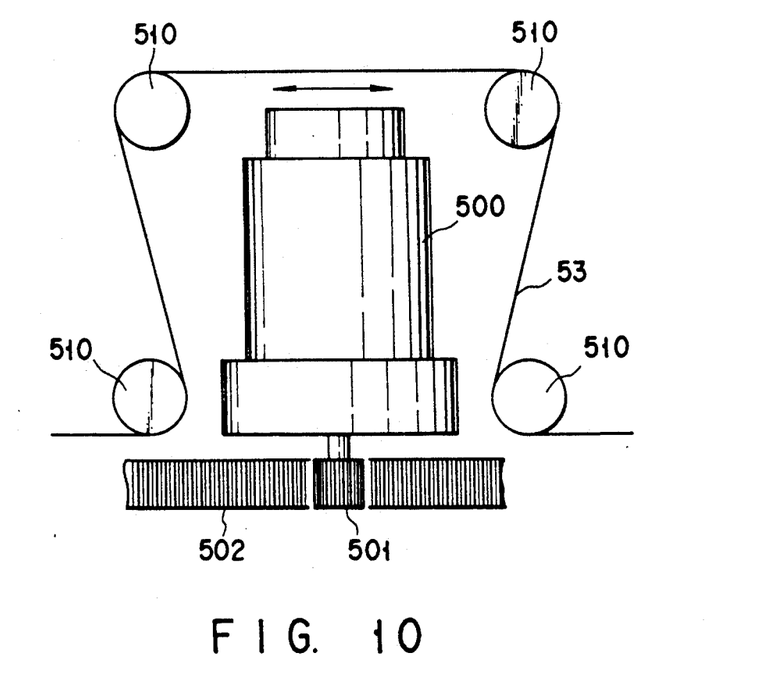
FIG. 10 schematically shows the drive section and a shield belt at the wafer carrier mechanism.

As shown in FIG. 10, the seal belt 53 is stretched round four guide rolls 510 which are located around the motor 500. Each of the guide rolls 510 is supported rotatable such that it is driven through the belt 53 by the motor 500. The seal belt 53 is not moved in this case but the motor 500 is moved along the X-axis by a rack 501 and a pinion 502. The seal belt 53 serves to prevent particles caused by the working drive parts from being scattered through that opening of the moving base 51 which is sealed by the seal belt 53.

Figure 11:
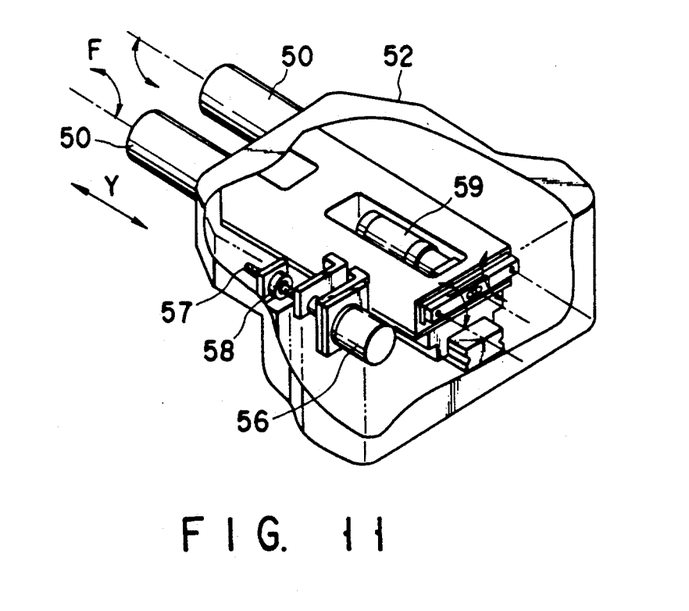
FIG. 11 is a perspective view showing the drive section for a wafer chuck at the wafer carrier mechanism.

As shown in FIG. 11, the wafer chuck 50 has a Y-axis drive motor 56, to the drive shaft of which a ball screw 57 is connected. The ball screw 57 is screwed into a ball nut 58 attached to the chuck base 52. When the motor 56 is rotated, the wafer chuck 50 is moved along the Y-axis.

Figure 12:
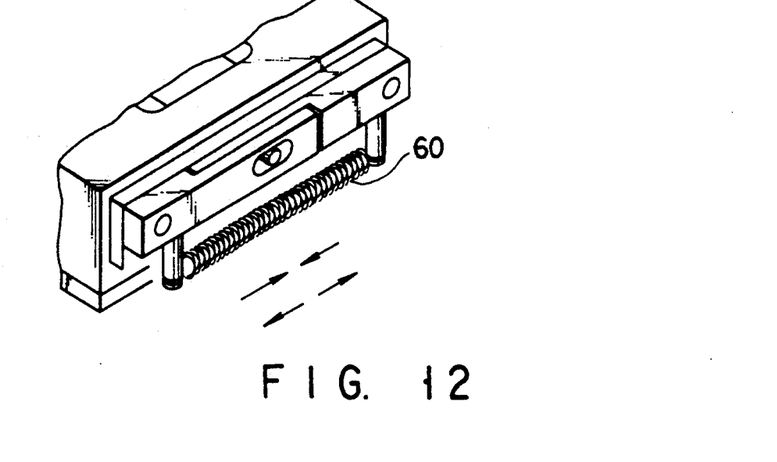
FIG. 12 is a perspective view showing a safety mechanism for the wafer chuck.

As shown in FIG. 12, a coil spring 60 is attached to the rear end of the chuck 50 to urge the chuck 50 to be closed. This coil spring serves as a safety member. Even if power is accidentally stopped while the wafers W are being carried in the chuck 50, therefore, the wafers W can be prevented from falling out of the chuck 50 by the coil spring 60.

Figure 13:
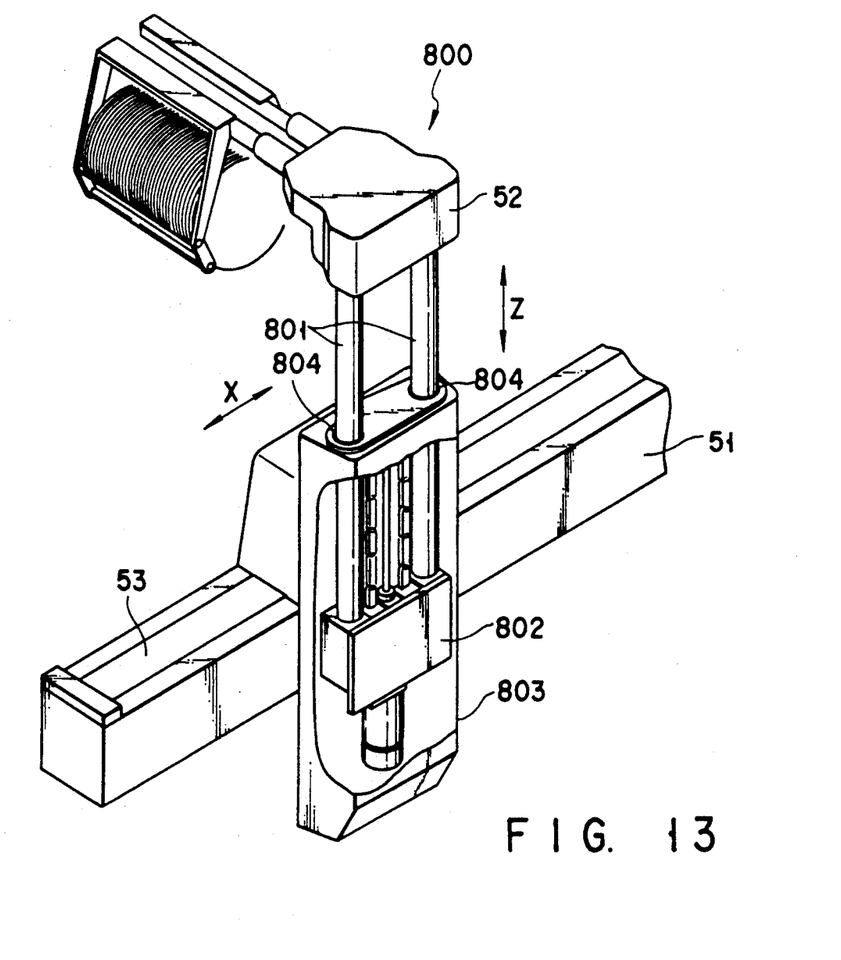
FIG. 13 is a perspective view showing another wafer carrier mechanism of the washing section partly cut.

As shown in FIG. 13, another type wafer carrier mechanism or unit 800 may be used. In the case of this wafer carrier unit 800, the chuck base 52 is supported by two pipe-shaped members 801 of double pipe structure each being made by covering an iron-made pipe with a resin-made pipe. A Z-axis mover 802 is housed in a Z-axis mover case 803 to move the chuck base 52 up and down along the Z-axis. A seal packing 804 is attached to the top of the case 803 and the pipe-shaped members 801 pass through the top of the case 803, a little contacting the seal packing 804.

This wafer carrier unit 800 can prevent, without using the bellows seal 54, dust and particles caused by the Z-axis mover 802 and the like from being scattered outside and chemical solution from entering into the Z-axis mover 802.

Figure 14:
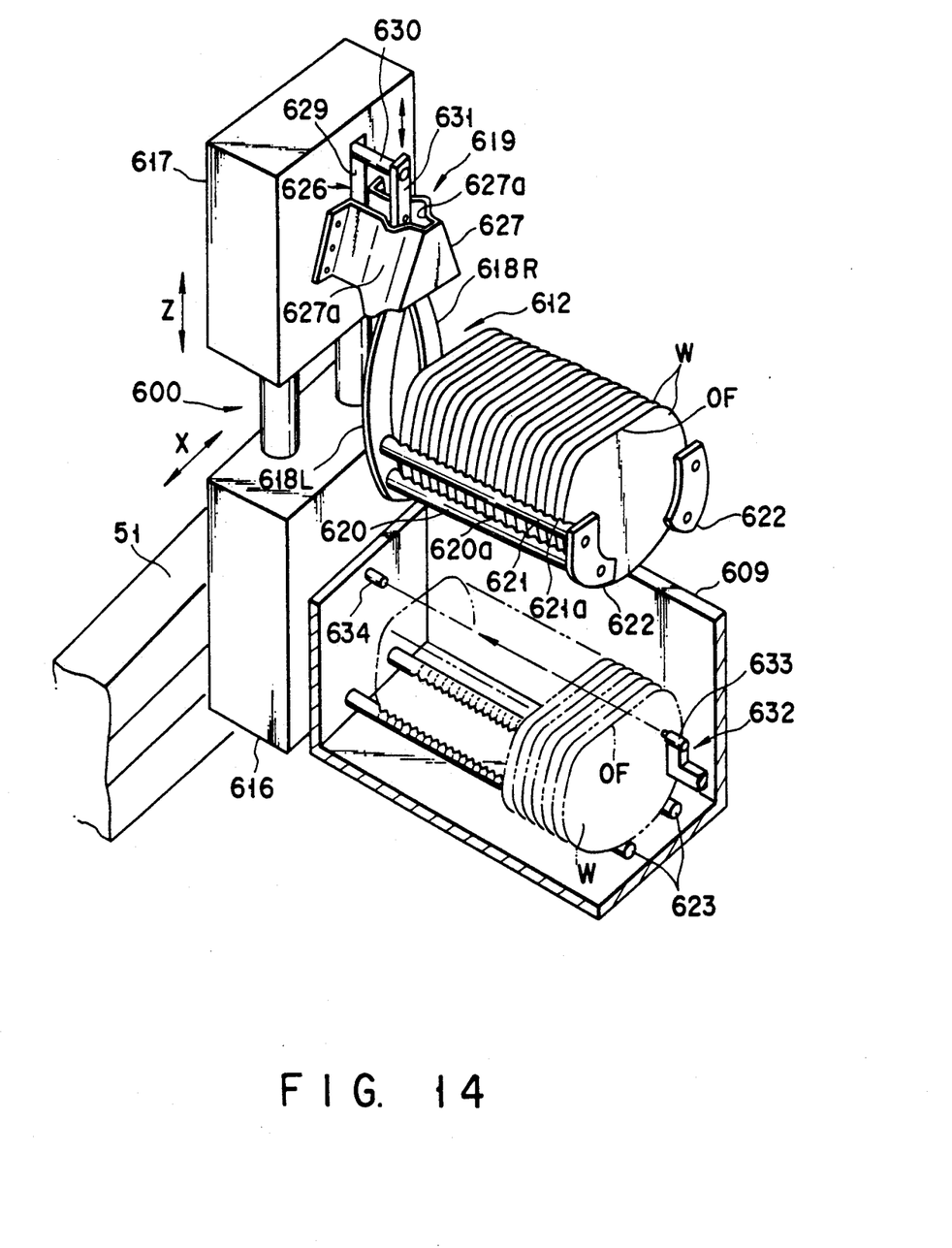
FIG. 14 is a perspective view showing chuck arms of a further wafer carrier mechanism and a wafer boat in the chemical solution vessel at the washing section.

As shown in FIG. 14, a further type wafer carrier mechanism or unit 600 may be used. A wafer chuck 612 includes a pair of right and left arms 618R and 618L whose upper ends are crossed and freely rotatably connected each other, and an arms opening and closing means 619. The wafers holding arms 618R and 618L are gently curved in such a direction that they are closed and particularly their lower halves are curved at same curvature as the outer circumference of each wafer. Rod-like wafer holder members 620 and 621 extend horizontal and parallel from each of the wafers holding arms 618R and 618L Grooves 620a and 621a in which the wafers W are seated are formed on the wafer holder members 620 and 621. Front ends of the lower and upper wafer holder members 620 and 621 extending from each of the wafers holding arms 618R and 618L are connected each other by an end plate 622, which serves to reinforce the wafer holder members 620 and 621 and prevent the wafers W from falling out of the wafer holder members 620 and 621.

The arms opening and closing means 619 is hinged to the upper ends of the arms 618R and 618L. A link member 625 and an arm lifter 626 cooperate with the wafers holding arms 618R and 618L to form a pantograph mechanism 624. A cover member 627 covers the pantograph mechanism 624.

A spring 628 is provided between right and left hinged portion of the pantograph mechanism 624. The pantograph mechanism 624 is pushed open (or pressed downward) by the spring 628.

The arm lifter 626 includes a rod 630 and a support 631. The rod 630 is arranged to move up and down along a vertical slit 629 in the front face of a block 617. A drive means (not shown) comprising a motor, gears and links is housed in the block 617. The support 631 is fixed to the front end of the rod 630 and a hinged portion 625a of the link member 625 is pivoted on the support 631.

The cover member 627 is tapered, spreading wider as it comes nearer to its lower end. Both sides of the cover member 627 are curved outward to form guide grooves 627a and both right and left ends of the pantograph section 624 are slidably contacted with inner faces of these guide grooves 627a of the cover member 627.

Figure 15A:
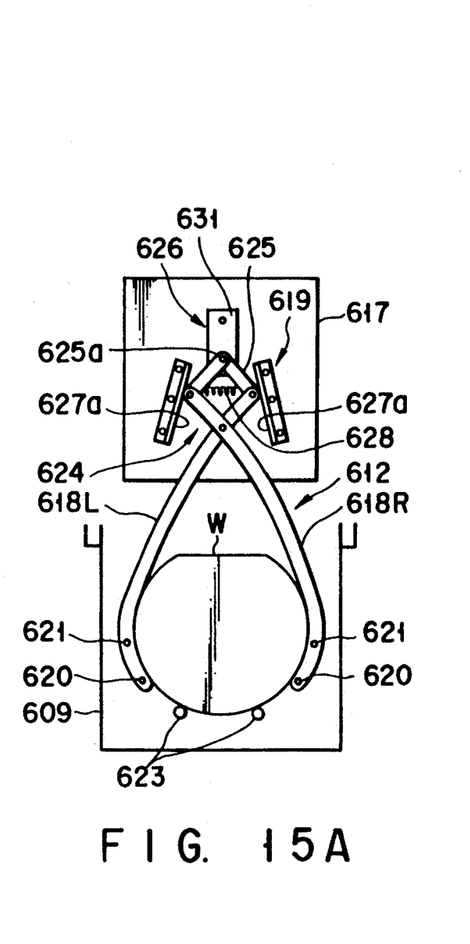
FIGS. 15A through 15C show how chuck arms of a still further wafer carrier mechanism are operated at the washing section.

The process of washing the wafers W will be carried out as follows: As shown in FIG. 15A, the wafer chuck 612 by which the wafers W not processed yet are held is moved into a process vessel 609 to mount the wafers W on wafers-mounted members 623. The retreat of the wafer chuck 612 out of the process vessel 609 is conducted opening and closing the wafers holding arms 618R and 618L along the outer circumference of the wafers a.

Figure 15B:
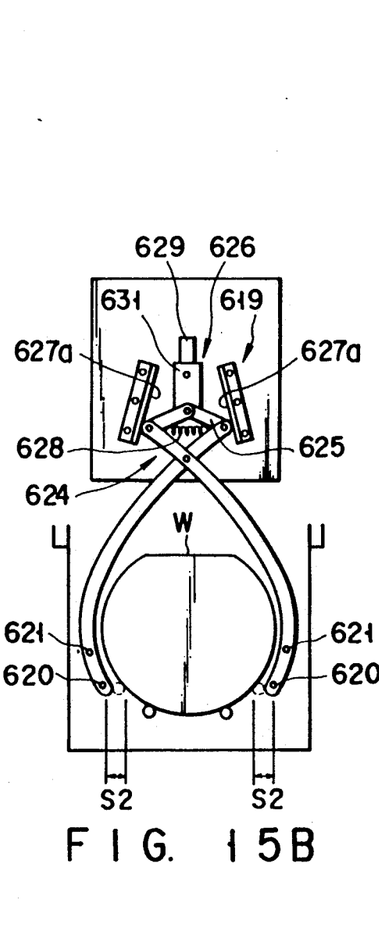

As shown in FIG. 15B, the right and left arms 618a and 618L of the wafer chuck 612 are opened until their lower wafer holder members 620 can have an interval a little larger than the diameter of each wafer W.

Figure 15C:
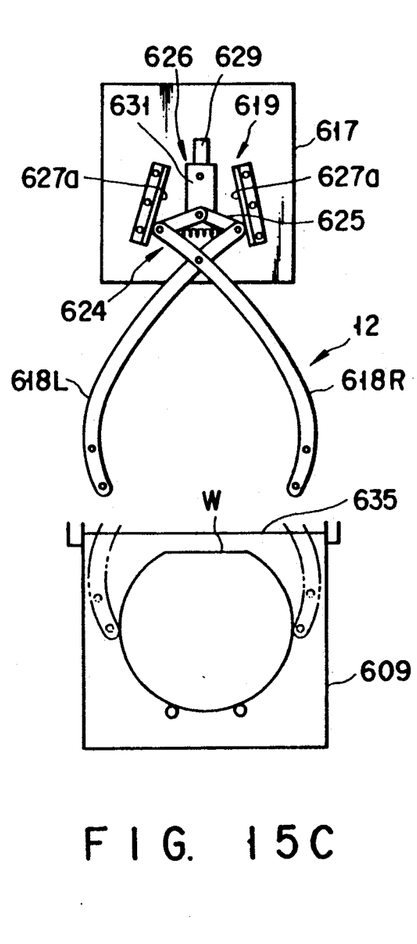

As shown in FIG. 15C, the block 617 is then moved upward to pull the wafer chuck 612 out of the process vessel 609. A washing liquid 635 is supplied from a supply source (not shown) into the process vessel 609 and the wafers W are washed in it. The washing liquid may be stored in the process vessel 609. The wafers W are immersed into the washing liquid and then washed in this case.

Figure 16:
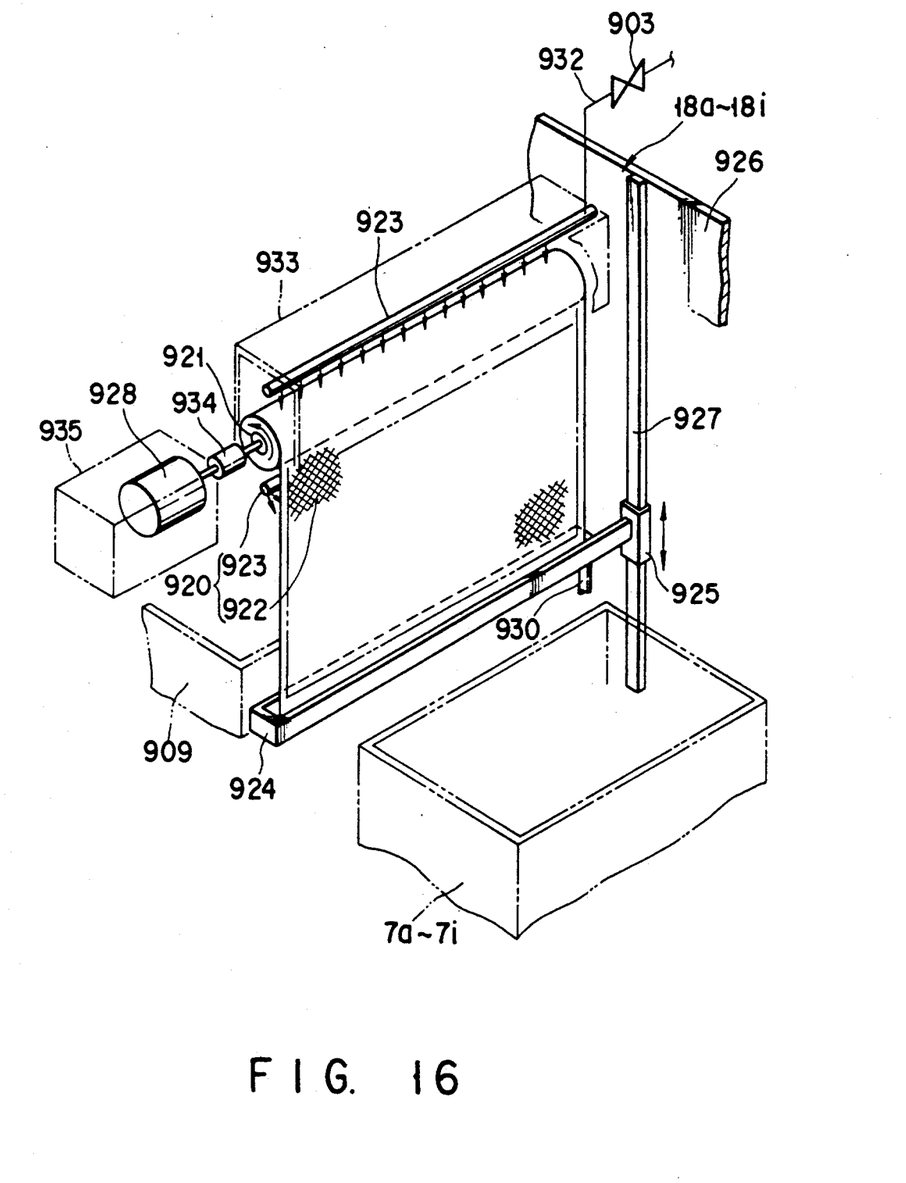
FIG. 16 is a perspective view showing a shutter interposed between the chemical solution vessels.

A shutter unit serving as a partition between the adjacent ones of process chambers 18a–18i will be described referring to FIG. 16.

A shutter unit 920 has a water-absorbing film sheet 922 wound round a drum 921. The film sheet 922 is dropped by lifters 928 and 934 to shut the opening through which both adjacent process chambers are communicated with each other. Nozzles 923 are located above and under the drum 921 and when water is sprayed to the film sheet 922 through these nozzles 923, water curtains 929 are created on both sides of the film sheet 922.

A water-receiving tray 924 made of vinyl chloride is arranged under the lower end of the film sheet 922 in this case. A movable element 925 made of vinyl chloride and attached to one end of the water-receiving tray 924 is made slidable alona a guide rail 927 which is also made of vinyl chloride and fixed vertical to a side wall 926 of the process chamber 18. When a motor 928 is rotated, the film sheet 922 is wound round the drum 921. When it is rotated backward or kept idling, the film sheet 922 drops due to its weight to close the opening 917.

The film sheet 922 is made by cloth or corrosion-proof fibers such as teflon. Or it is made by putting corrosion-proof fibers and films one over another. The bottom of the water-receiving tray 924 is tilted to one end and a drain pipe 930 is connected to a drain hole (not shown) in this bottom end of the tray 924. Water sprayed through the nozzles 923 and dropped along the film sheet 922 can be therefore drained outside through the drain pipe 930.

It will be described how wafers and cassettes are washed.

These washing processes except the drying ones are carried out under normal temperature and pressure. Two cassettes C are mounted in the boat 14 at the input buffer section 3 by a robot (not shown). Twenty sheets of 8-inch silicon wafers W are housed in each of the cassettes C. Orientation flats of the semiconductor wafers W in each of the cassettes C in the boat 14 are aligned with one another by the aligning unit (not shown). The cassettes C are carried to the loader section 5 by the cassette carrier unit 12. However, they are housed in the cassettes stocking unit 13 when other cassettes are already present in the loader section 5.

The wafers W in the cassettes C are lifted in the loader section 5 and held together, total fifty sheets, by the chuck 50 of the carrier unit 8. They are then carried into the second process chamber 18b. While being successively carried in this manner by the three carrier units 8, they are processed by chemical solution, water, water, chemical solution, water, water and finally dried in the chambers 18b–18i. When they are dried by heat, they are carried to the unloader section 6. Those cassettes C which have washed clean are waiting in the unloader section 6. The wafers W are housed in these two clean cassettes C and carried to the output buffer section 4 and then outside from the boat 14.

The cassettes C which have been made vacant in the loader section 5 are lifted to the cassettes washing passage 100 and mounted on the moving stage 110 by the lifter 70. The number of the cassettes mounted in this case may be one or two. Or wafers W may be housed in the cassettes C.

The carrying of the cassettes C in the passage 100 by wire drive is made intermittent. Namely, it is stopped when the cassettes C are transferred onto the moving stage 110, when the shutters 106 of the water washing chamber 102 and heat drying chamber 104 are opened and closed, and when the cassettes C are being water-washed and heat-dried.

The cassettes C which have been made clean are carried from the passage 100 to the unloader section 6 and mounted on the table 32 by the lifter 70. The wafers W which have also been made clean are then housed in the clean cassettes C by the carrier unit 8 and the lifter 60.

According the above-described washing system of the present invention, the whole time needed to process the cassettes C in a cycle, while carrying them from the loader 5 to the unloader section 6, is about 5 minutes, shortest. In addition, the process of washing the cassettes C can be carried out together with the process of washing the wafers W. This can make the working efficiency and the through-put quite higher.

Further, the wafers W which have been made clean are returned into the clean cassettes C. This can prevent particles from adhering to the wafers. The productivity of semiconductor devices can be enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A washing system comprising;
   a wafer washing section having means for washing plural semiconductor wafers by chemical solution, means for washing the wafers by water and means for drying the wafers;
   a cassette washing section having means for washing plural cassette by water and means for drying the cassettes;
   loader section for taking out the wafers from the cassette and for loading the wafers into the wafer washing section;
   an unloader section for returning the washed wafers in the washed cassette and unloading the washed wafers from the wafer washing section;
   means for carrying the wafers in the wafer washing section; and
   means for carrying the cassettes from the loader section to the cassette washing section.

2. The washing system according to claim 1, wherein said cassette washing section is arranged above said wafer washing section.

3. The washing system according to claim 1, wherein said cassette washing section includes a cassettes carrying passage extending substantially horizontal.

4. The washing system according to claim 1, further comprising said cassette washing section includes a cassette carrying passage and shutter means provides at an inlet and an outlet of said cassette carrying passage.

5. The washing system according to claim 1, wherein said cassette carrying means includes a cassette lifter for lifting the plural cassettes from the loader section to the cassette washing section, and a wire drive unit for carrying the cassettes in the cassette washing section.

6. The washing system according to claim 1, wherein said wafer carrying means includes a belt drive unit provided with seal belts for preventing particles caused by its drive section from being scattered outside.

7. The washing system according to claim 1, wherein said cassette washing section includes means for spraying water to the cassettes to wash them.

8. The washing system according to claim 1, wherein said cassette washing section includes means for blowing dry gas to the cassettes to heat and dry them.

9. The washing system according to claim 1, further comprising an input buffer section located next to the loader section to receive the cassettes.

10. The washing system according to claim 1, further comprising said input buffer section includes unit for stocking the cassettes.

11. The washing system according to claim 1, further comprising an output buffer section located next to the unloader section to carry the cassettes outside the system.

12. The washing system according to claim 1, further comprising said output buffer section includes another unit for stocking the cassettes.

* * * * *